US009841161B2

(12) United States Patent
Ji et al.

(10) Patent No.: US 9,841,161 B2
(45) Date of Patent: Dec. 12, 2017

(54) LENS FOR LIGHT EMITTER, LIGHT SOURCE MODULE, LIGHTING DEVICE, AND LIGHTING SYSTEM

(71) Applicants: Won Soo Ji, Hwaseong-si (KR); Sung A Choi, Yongin-si (KR); Sang Woo Ha, Seongnam-si (KR); Tetsuo Ariyoshi, Suwon-si (KR)

(72) Inventors: Won Soo Ji, Hwaseong-si (KR); Sung A Choi, Yongin-si (KR); Sang Woo Ha, Seongnam-si (KR); Tetsuo Ariyoshi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/637,666

(22) Filed: Mar. 4, 2015

(65) Prior Publication Data

US 2016/0033108 A1    Feb. 4, 2016

(30) Foreign Application Priority Data

Jul. 30, 2014    (KR) .................. 10-2014-0097209

(51) Int. Cl.
*F21V 5/04* (2006.01)
*H05B 33/08* (2006.01)
(Continued)

(52) U.S. Cl.
CPC ............ *F21V 5/04* (2013.01); *G02B 19/0028* (2013.01); *G02B 19/0057* (2013.01); *G02B 19/0071* (2013.01); *H01L 33/58* (2013.01); *H05B 33/0872* (2013.01); *F21K 9/23* (2016.08); *F21K 9/27* (2016.08); *F21K 9/60* (2016.08); *F21V 23/045* (2013.01); *F21V 23/0442* (2013.01); *F21V 29/507* (2015.01);
(Continued)

(58) Field of Classification Search
CPC ....... H05B 33/08; H05B 33/0872; F21V 5/00; F21V 5/04; F21V 5/048; G02B 19/0028; G02B 19/0057; G02B 19/007
See application file for complete search history.

(56) References Cited

U.S. PATENT DOCUMENTS 2,874,268 A    2/1959 Martin
6,372,608 B1    4/2002 Shimoda et al.
(Continued)

FOREIGN PATENT DOCUMENTS

CN    201858591 U    6/2011
EP    2335819 A1    6/2011
(Continued)

*Primary Examiner* — Thai Pham
(74) *Attorney, Agent, or Firm* — Sughrue Mion, PLLC

(57) ABSTRACT

There is provided a lens for a light emitter which includes: a bottom surface; an incident surface connected to the bottom surface at a central region of the bottom surface and disposed on or above a light source to allow light emitted from the light source to be made incident thereto and travel in an interior of the lens; and an output surface connected to the bottom surface at an edge of the bottom surface and configured to allow the light which has traveled in the interior of the lens to be emitted outwardly therefrom, wherein the central region of the bottom surface protrudes with respect to the other region of the bottom surface.

14 Claims, 14 Drawing Sheets

(51) Int. Cl.
*H01L 33/58* (2010.01)
*G02B 19/00* (2006.01)
*F21V 23/04* (2006.01)
*F21V 29/507* (2015.01)
*F21V 29/76* (2015.01)
*F21V 29/77* (2015.01)
*F21Y 105/10* (2016.01)
*F21K 9/23* (2016.01)
*F21K 9/27* (2016.01)
*F21K 9/60* (2016.01)
*F21Y 115/10* (2016.01)
*F21Y 113/10* (2016.01)

(52) U.S. Cl.
CPC .......... *F21V 29/763* (2015.01); *F21V 29/773* (2015.01); *F21Y 2105/10* (2016.08); *F21Y 2113/10* (2016.08); *F21Y 2115/10* (2016.08)

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,244,924 B2 | 7/2007 | Kiyomoto et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,551,372 B2 | 6/2009 | Xun et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,837,359 B2 | 11/2010 | Danek et al. | |
| 7,926,962 B2 | 4/2011 | Tsai | |
| 7,940,350 B2 | 5/2011 | Jeong | |
| 7,959,312 B2 | 6/2011 | Yoo et al. | |
| 7,963,680 B2 * | 6/2011 | Yoon ........................ | F21V 5/04 359/366 |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,585,239 B1 * | 11/2013 | Tseng ........................ | F21V 5/04 362/244 |
| 8,596,829 B2 | 12/2013 | Yamaguchi | |
| 8,735,931 B2 | 5/2014 | Han et al. | |
| 8,766,295 B2 | 7/2014 | Kim | |
| 8,967,833 B2 * | 3/2015 | Wang ........................ | F21V 5/04 359/708 |
| 9,255,689 B2 * | 2/2016 | Wang He ................ | F21V 5/045 |
| 2009/0052192 A1 * | 2/2009 | Kokubo ............. | G02B 19/0014 362/311.09 |
| 2009/0116245 A1 * | 5/2009 | Yamaguchi .............. | G02B 3/04 362/311.01 |
| 2011/0044053 A1 | 2/2011 | Yamaguchi | |
| 2011/0096553 A1 | 4/2011 | Shimokawa | |
| 2011/0164426 A1 | 7/2011 | Lee | |
| 2011/0280023 A1 | 11/2011 | Lee et al. | |
| 2012/0120666 A1 * | 5/2012 | Moeller .................... | F21V 5/04 362/308 |
| 2012/0175655 A1 | 7/2012 | Cheng et al. | |
| 2013/0229808 A1 * | 9/2013 | Wang ........................ | F21V 5/04 362/311.01 |

FOREIGN PATENT DOCUMENTS

KR 10-2011-0059604 A 6/2011
KR 10-1109090 B1 1/2012

* cited by examiner

LENS FOR LIGHT EMITTER, LIGHT SOURCE MODULE, LIGHTING DEVICE, AND LIGHTING SYSTEM

CROSS-REFERENCE TO THE RELATED APPLICATION

This application claims priority from Korean Patent Application No. 10-2014-0097209 filed on Jul. 30, 2014, in the Korean Intellectual Property Office, the disclosure of which is incorporated herein in its entirety by reference.

BACKGROUND

Apparatuses consistent with exemplary embodiments of the inventive concept relate to a lens for a light emitter, a light source module, a lighting device, and a lighting system.

Among lenses used in a emitter, a wide beam angle lens is used to diffuse light across a wider region in a lateral direction from a central portion. In this case, however, light incident to the lens may not be uniformly diffused and light distribution may increase in a region according to various light source forms of packages. An uneven distribution of diffused light may cause defective optical uniformity such as mura in a lighting device or in a display device

SUMMARY

A plurality of exemplary embodiments may provide an apparatus and method for preventing generation of mura and uniformly distributing light in a light emitter, light source module and light device.

However, the inventive concept is not limited to the embodiments and various other aspects and effects may be recognized from these embodiments described hereinafter.

According to an exemplary embodiment, there is provided a lens for a light emitter which may include: a bottom surface; an incident surface connected to the bottom surface at a central region of the bottom surface and disposed on or above a light source to allow light emitted from the light source to be made incident thereto and travel in an interior of the lens; and an output surface connected to the bottom surface at an edge of the bottom surface and configured to allow the light which has traveled in the interior of the lens to be emitted outwardly therefrom, wherein the central region of the bottom surface protrudes with respect to the other region of the bottom surface.

The incident surface may form a surface of a recess portion recessed from the central region of the bottom surface through which an optical axis of the light source passes, in a direction toward the output surface, and the bottom surface may include a first surface connected to the output surface at the edge of the bottom surface and extending toward a center of the bottom surface, a second surface bent from an end of the extended first surface and extending toward the light source, and a third surface bent from an end of the second surface and extending toward the recess portion.

The first surface and the third surface may form a step portion formed of the second surface.

The second surface may be perpendicular or sloped obliquely with respect to the first surface and the third surface.

The second surface and the third surface may form an annular structure surrounding the recess portion.

The recess portion may be disposed to face the light source.

The lens may further include a support portion protruding from the bottom surface.

According to another exemplary embodiment, there is provided a lens for a light emitter which may include: a bottom surface; an incident surface forming a recess portion recessed at a center of the bottom surface and disposed on or above a light source to allow light emitted from the light source to be made incident thereto and travel in an interior of the lens; an output surface connected to the bottom surface at an edge of the bottom surface and configured to allow the light which has traveled in the interior of the lens to be emitted outwardly therefrom; and a protrusion provided on a circumference of the recess portion of the bottom surface and protruding to form a step with respect to the bottom surface.

The protrusion may have an annular shape having a through hole, and an inner surface of the through hole may be connected to the incident surface.

The protrusion may be formed of a material identical to that of the lens.

The protrusion may have an uneven surface for scattering light.

The lens may further include a support portion provided to be adjacent to the protrusion on the bottom surface, and the support portion may protrude longer than the protrusion with respect to the light source.

According to still another exemplary embodiment, there is provided a lens for a light emitter which may include: a bottom surface; an incident surface forming a recess from the bottom surface and disposed on or above a light source; an output surface facing the incident surface through an interior of the lens; and a protrusion formed on the bottom surface, disposed around a circumference of the recess and protruding from the bottom surface, wherein an inner surface of the protrusion facing a center of the bottom surface is connected to the incident surface to form a part of the incident surface.

The protrusion may be formed of a material identical or substantially identical to that of the lens.

According to still another exemplary embodiment, there is provided a light source module which may include: the above lens and a light emitter, wherein the light emitter protrusion may be formed of a material identical or substantially identical to that of the lens.

Here, a bottom-most edge of the inner surface of the protrusion may be disposed below a surface of the light emitter from which all beams of the light is emitted.

According to still another exemplary embodiment, there is provided a lighting system which may include: a lighting unit including at least one light source module; a sensor configured to measure at least one air condition; a controller configured to compare the at least one air condition measured by the sensor with a preset value; and a driver configured to supply power to the lighting unit, wherein the controller is further configured to determine a color temperature of the lighting unit based on a result of the comparison.

The lighting unit may include: a plurality of lighting devices configured to emit respective lights having respective color temperatures. Here, the controller may be further configured to determine light having the determined color temperature of the lighting unit by controlling amounts of the respective lights.

Further, the controller may be also configured to control the driver to supply different amounts of power to the lighting devices to emit the respective lights having the respective color temperatures.

BRIEF DESCRIPTION OF DRAWINGS

The above and other aspects, features and other advantages will be more clearly understood from the following detailed description taken in conjunction with the accompanying drawings, in which.

DETAILED DESCRIPTION

Figure 1:
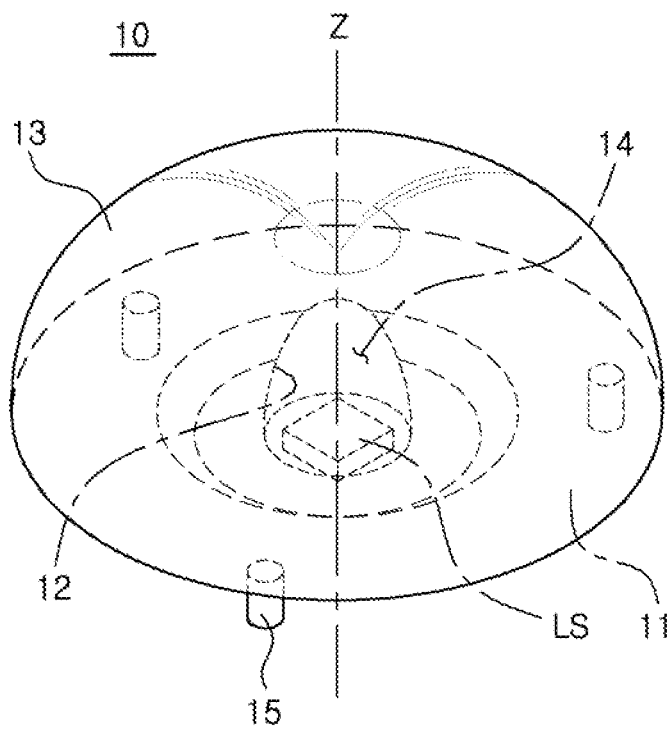
FIG. 1 is a perspective view schematically illustrating a lens for a light emitter, according to an exemplary embodiment.

Hereinafter, exemplary embodiments of the inventive concept will be described in detail with reference to the accompanying drawings.

The inventive concept may, however, be exemplified in many different forms and should not be construed as being limited to the specific embodiments set forth herein. Rather, these embodiments are provided such that this disclosure will be thorough and complete, and will fully convey the scope of the inventive concept to those skilled in the art.

In the drawings, the shapes and dimensions may be exaggerated for clarity. Thus, in the drawings, the shapes and dimensions of elements may be exaggerated for clarity, and the same reference numerals will be used throughout to designate the same or like elements. In this disclosure, terms such as "above", "upper portion", "upper surface", "below", "lower portion", "lower surface", "lateral surface", and the like, are determined based on the drawings, and in actuality, the terms may be changed according to a direction in which a device or an element is disposed.

Hereinafter, a lens for a light emitter according to an exemplary embodiment will be described with reference to FIGS. 1 though 3.

Figure 2:
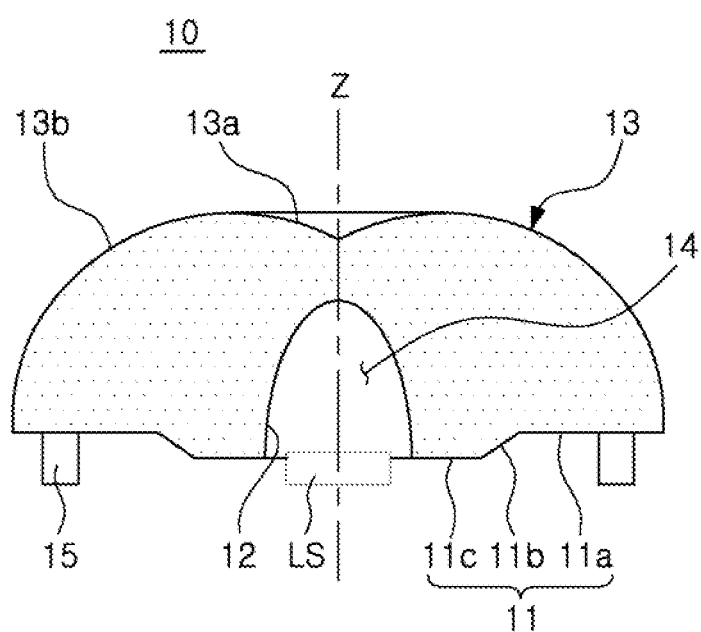
FIG. 2 is a cross-sectional view of the lens for a light emitter of FIG. 1, according to an exemplary embodiment.
Figure 3:
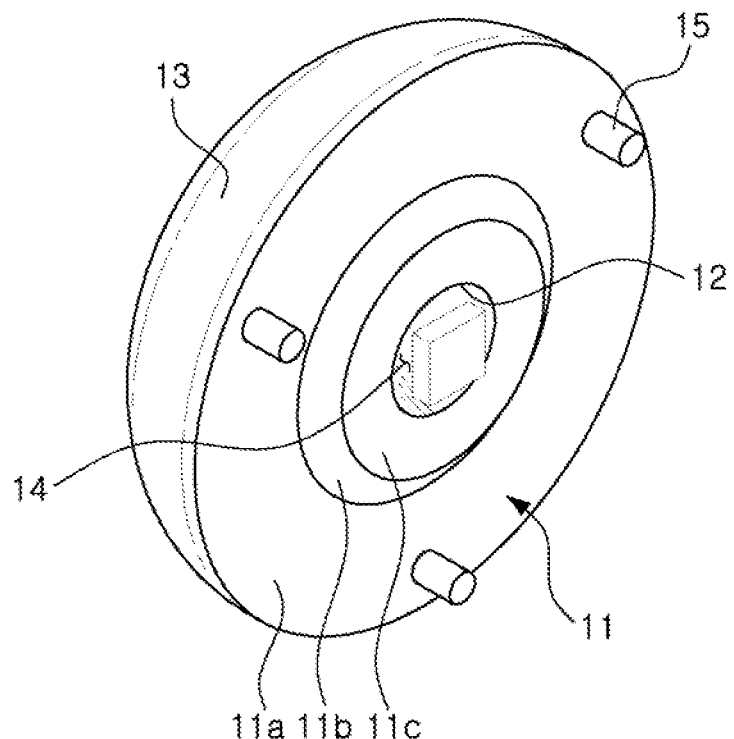
FIG. 3 is a bottom view of the lens for a light emitter of FIG. 1, according to an exemplary embodiment.

FIG. 1 is a perspective view schematically illustrating a lens for a light emitter according to an exemplary embodiment, FIG. 2 is a cross-sectional view of the lens for a light emitter of FIG. 1, and FIG. 3 is a bottom view of the lens for a light emitter of FIG. 1.

Referring to FIGS. 1 through 3, a lens 10 for a light emitter according to an exemplary embodiment may be disposed on a light source LS to adjust a beam angle of light emitted from the light source LS. Here, the light source LS may include, for example, a light emitter. The lens 10 may receive a wide beam angle diffusing light from the light emitter to implement a wide beam angle.

As illustrated in FIGS. 2 and 3, the lens 10 may include a bottom surface 11, an incident surface 12 on which light from the light source LS is incident, and an output surface 13 from which the light is emitted outwardly.

The bottom surface 11 may be a surface facing the light source and having a circular, horizontal cross-sectional structure. A recess portion 14 may be provided in the center of the bottom surface 11 through which an optical axis Z of the light source LS passes, and recessed in a direction in which light is output.

The recess portion 14 may be rotationally symmetrical with respect to the optical axis Z that passes through the center of the lens 10, and a surface thereof may be defined as the incident surface 12 to which light is made incident. Namely, the incident surface 12 may form the surface of the recess portion 14. Accordingly, light generated by the light source LS may pass through the incident surface 12 of the recess portion 14 and travel in an interior of the lens 10.

The recess portion 14 may be open outwardly through the bottom surface 11 and may be disposed to face the light source LS on an upper side of the light source LS.

The bottom surface 11 may have an overall non-planar plate structure in which a central region including a region connected to the incident surface 12 partially protrudes toward the light source LS. Namely, unlike a general structure in which the entirety of the bottom surface 11 is flat, the circumferential portion of the recess portion 14 may partially protrude.

As illustrated in FIGS. 2 and 3, the bottom surface 11 may include a first surface 11a extending from the edge connected to the output surface 13 to the central region, a second surface 11b bent from an end of the extended first surface 11a and extending toward the light source LS, and a third surface 11c bent from end of the second surface 11b and extending to be connected to the incident surface 12.

Namely, the second surface 11b and the third surface 11c may protrude from the first surface 11a corresponding to the most portion of the bottom surface 11 and surround the recess portion 14, forming an annular shape. The third surface 11c may be parallel to the first surface 11a and may have a step portion, formed of the second surface 11b, with respect to the first surface 11a (In other words, the third surface 11c may be parallel to the first surface 11a and may have a step portion, which corresponds to the length of the second surface 11b, with respect to the first surface 11a). The second surface 11b may be perpendicular or may be sloped obliquely with respect to the first surface 11a and the third surface 11c.

The bottom surface 11 may have a support portion 15 protruding from an outer region thereof. The outer region may be defined as a region adjacent to the edge of the lens 10 relatively to a central region in which the second surface 11b and the third surface 11c protrude. Namely, in this disclosure, the central region may refer to the region where the second surface 11b and third surface 11c are protruded in the bottom surface 11, and the outer region may refer to the region occupied by the first surface 11a surrounding the central region.

The support portion 15 may be integrally formed with the lens 10 or may be attached to the first surface 11a corresponding to the outer region through an adhesive, or the like. A plurality of support portions 15 may be provided and extend to protrude toward the light source LS further than the third surface 11c.

Figure 9:
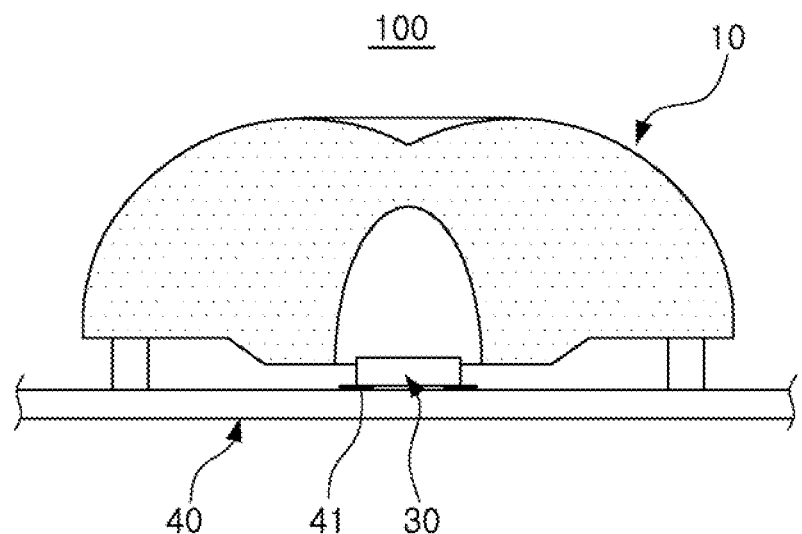
FIG. 9 is a cross-sectional view schematically illustrating a light source module, according to an exemplary embodiment.

When the lens 10 is mounted, for example, on a board, the support portions 15 may fix and support the lens 10 (please refer to FIG. 9). Namely, the lens 10 may be mounted on the board through the support portions 15. The bottom surface 11 may be positioned on or above the light source LS and the incident surface 12 may be disposed to face the light source LS.

The output surface 13, a surface from which light which has entered the interior of the lens 10 through the incident surface 12 is emitted outwardly, corresponds to an upper surface of the lens 10. The output surface 13 may protrude from the edges connected to the bottom surface 11 in an upward direction (light output direction) to have a dome shape, and the center through which the optical axis Z passes may be concavely depressed toward the recess portion 14 to have a point of inflection. In detail, the output surface 13 may include a concave portion 13a depressed toward the recess portion 14 along the optical axis Z to have a concavely curved surface and a convex portion 13b continuously extending from the rim of the concave portion 13a to the edges and having a convexly curved surface.

Figure 4:
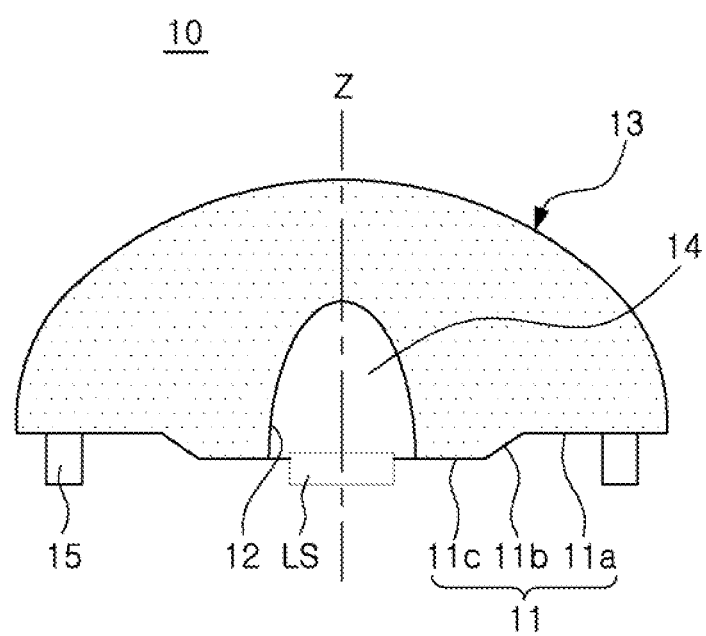
FIG. 4 is a cross-sectional view schematically illustrating a modified example of a light output surface of the lens of FIG. 2, according to an exemplary embodiment.

As illustrated in FIG. 4, the output surface 13 may protrude from the edges connected to the bottom surface 11 in an upward direction (light output direction) to have a dome shape overall.

The lens 10 may be formed of a resin having transparency or translucency, for example, polycarbonate (PC), polymethylmetacylate (PMMA), acryl, and the like. Also, the lens 10 may be formed of glass, but the inventive concept is not limited thereto.

The lens may contain a light dispersion material within a range from about 3% to 15%. The light dispersion material may be formed of or include at least one of $SiO_2$, $TiO_2$, and $Al_2O_3$, for example. If the light dispersion material is contained in an amount of less than 3%, light may not be sufficiently dispersed, so a light dispersion effect cannot be expected. If the light dispersion material is contained in an amount of more than 15%, an amount of light emitted outwardly through the lens 10 may be reduced to degrade light extraction efficiency.

The lens 10 may be formed by injecting a fluidic solvent into a mold and solidifying the same. For example, injection molding, transfer molding, compression molding, and the like, may be used.

Figure 5:
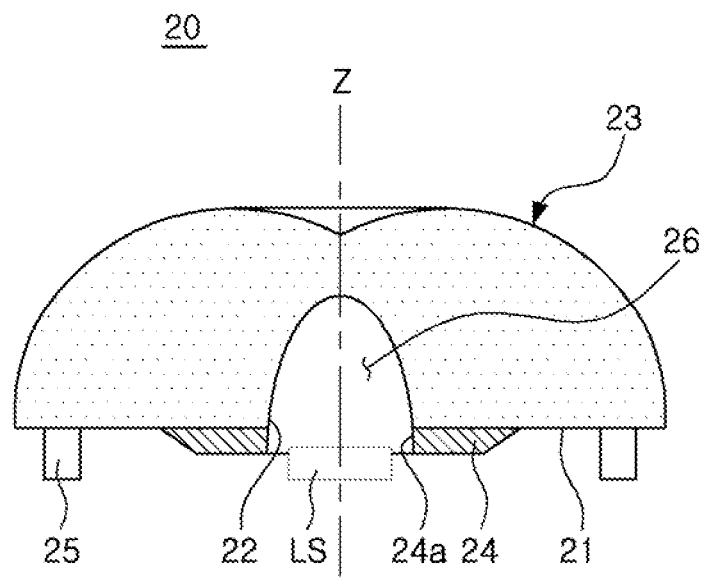
FIG. 5 is a cross-sectional view illustrating a lens for a light emitter, according to another exemplary embodiment.

A lens for a light emitter according to another exemplary embodiment will be described with reference to FIGS. 5 and 6. FIG. 5 is a cross-sectional view illustrating a lens for a light emitter according to another exemplary embodiment, and FIG. 6 is an enlarged perspective view schematically illustrating a protrusion of FIG. 5.

Figure 6:
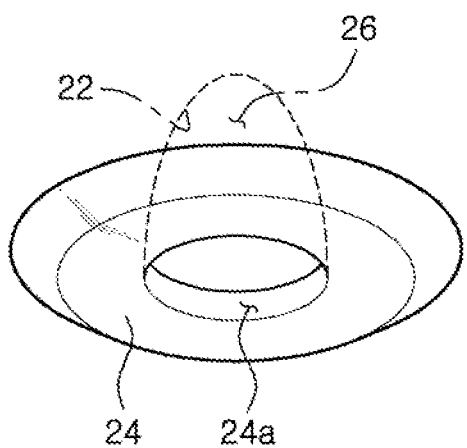
FIG. 6 is an enlarged perspective view schematically illustrating a protrusion of FIG. 5, according to an exemplary embodiment.

A basic structure of a lens 20 according to an exemplary embodiment illustrated in FIGS. 5 and 6 is substantially identical to that of the lens according to the exemplary embodiment illustrated in FIGS. 1 through 4, except for a bottom surface 21. Hereinafter, redundant descriptions of the same components as those of the former exemplary embodiment will be omitted and the structure of the bottom surface 21 will mainly be described.

Referring to FIGS. 5 and 6, the lens 20 for a light emitter according to the present exemplary embodiment may include a bottom surface 21 disposed on or above a light source LS, an incident surface 22 to which light from the light source LS is made incident, an output surface 23 from which the light is emitted outwardly, and a protrusion 24 provided on the bottom surface 21.

The bottom surface 21 may be a surface facing the light source LS and having a circular, horizontal cross-sectional structure. A recess portion 26 may be provided in the center of the bottom surface 21 through which an optical axis Z of the light source LS passes, and recessed in a direction in which light is output.

The recess portion 26 may be rotationally symmetrical with respect to the optical axis Z that passes through the center of the lens 20, and a surface thereof may be defined as the incident surface 22 to which light is made incident. The recess portion 26 may be open outwardly through the bottom surface 21 and may be disposed to face the light source LS on an upper side of the light source LS.

The output surface 23, a surface from which light which has entered the interior of the lens 20 through the incident surface 22 is emitted outwardly, corresponds to an upper surface of the lens 20. The output surface 23 may protrude from the edges connected to the bottom surface 21 in an upward direction (light output direction). The output surface 23 may have the same structure as that of the output surface 13 of FIG. 2, so a detailed description thereof will be omitted.

The protrusion 24 may be provided along the circumference of the recess portion 26 and protrude toward the light source LS to form a step with respect to the bottom surface 21. The protrusion 24 may protrude from a partial region adjacent to the recess portion 26 in the bottom surface 21 and surround the recess portion 26.

The protrusion 24 may have an annular shape including a through hold 24a, and an inner surface of the through hole 24a may be connected to the incident surface 22. Thus, the incident surface 22 may extend from the bottom surface 21 by means of the protrusion 24 to a bottom surface of the protrusion 24. Namely, the incident surface 22 may be defined as an integrally connected surface including the surface of the recess portion 26 and the inner surface of the through hole 24a.

The protrusion 24 may be formed of a material identical or substantially identical to that of the lens 20. The protrusion 24 may be attached to the bottom surface 21 through an adhesive, or the like.

A concavo-convex structure (or an uneven structure) for scattering light may be formed on the surface of the protrusion 24. The concavo-convex structure may be formed by performing a corrosion treatment on the surface of the protrusion 24.

A support portion 25 may be provided on the bottom surface 21 in a portion adjacent to the protrusion 24. When the lens 20 is mounted, for example, on a board, the support portions 25 may fix and support the lens 20. Namely, the lens 20 may be mounted on the board through the support portion 25.

The support portion 25 may be protruded longer than the protrusion 24 with respect to the light source LS. Thus, the protrusion 24 may be positioned on or above the light source LS, and the incident surface 22 may be disposed to face the light source LS.

Figure 7A:
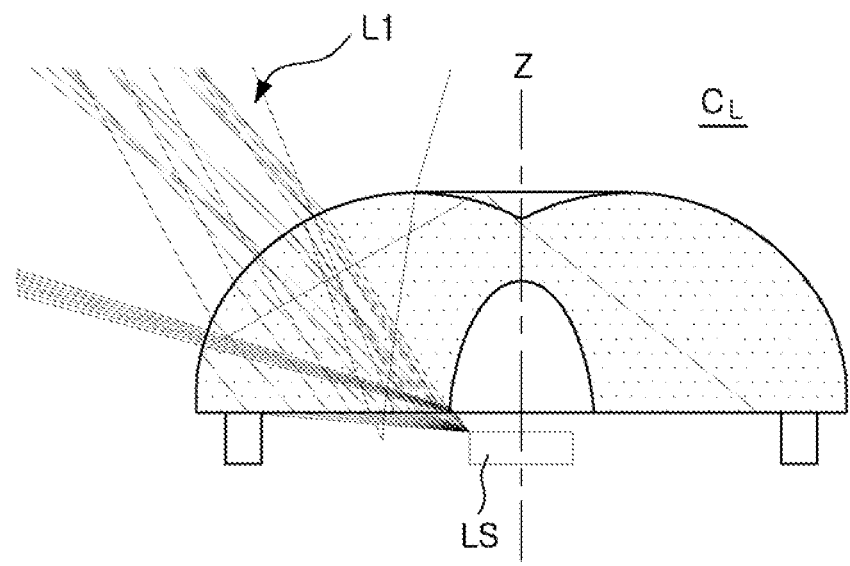
FIGS. 7A and 7B are cross-sectional views schematically illustrating optical paths in a lens according to a comparative example and a lens according to an exemplary embodiment.
Figure 7B:
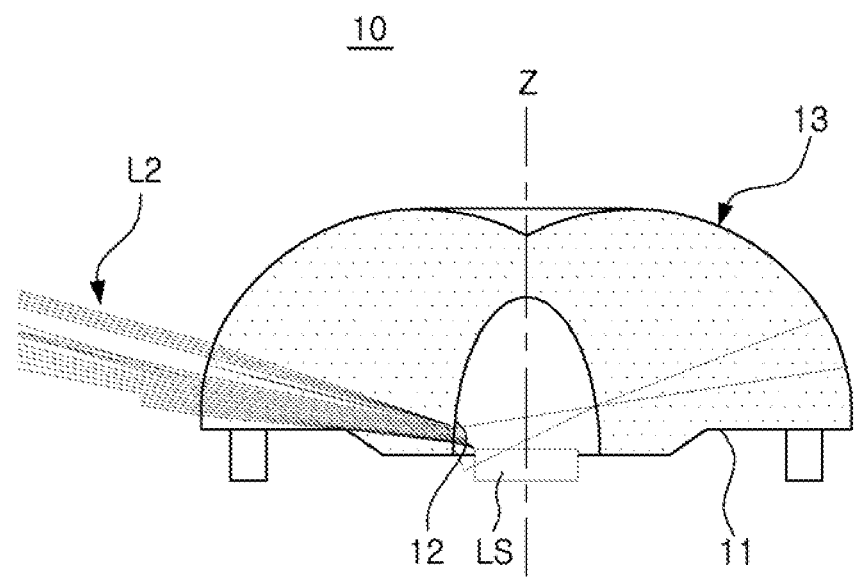
Figure 8A:
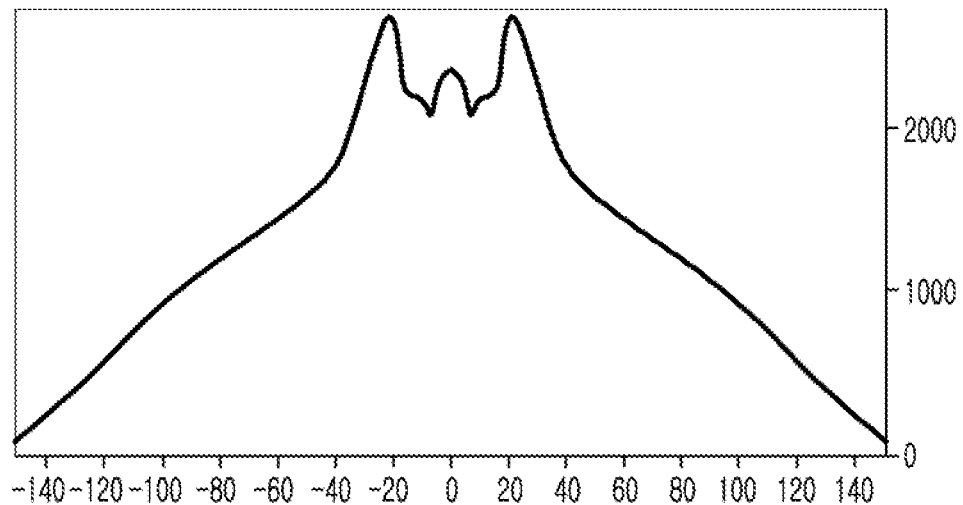
FIGS. 8A and 8B are graphs illustrating distributions of light diffused by lenses, according to exemplary embodiments.
Figure 8B:
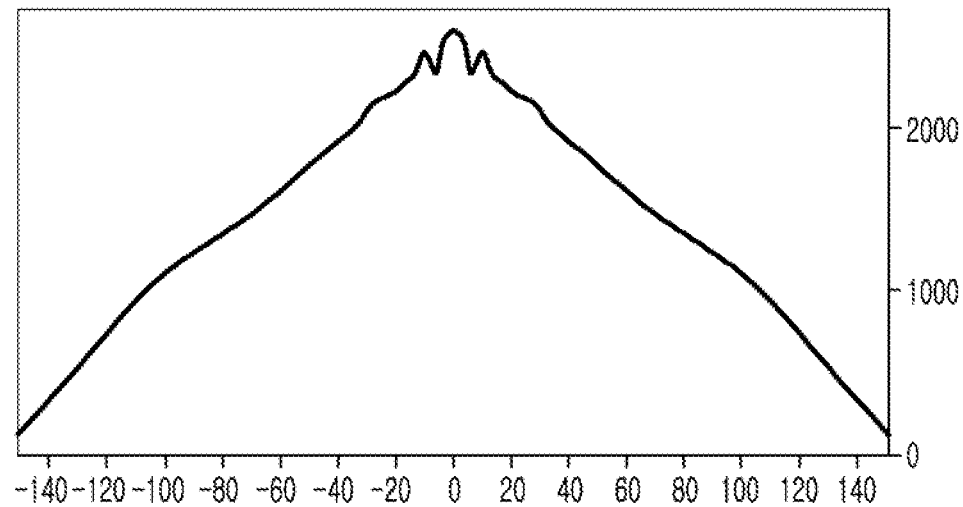

FIGS. 7A and 7B are cross-sectional views schematically illustrating optical paths in a lens according to a comparative example and a lens according to an exemplary embodiment, and FIGS. 8A and 8B are graphs illustrating distributions of light diffused by lenses.

The wide beam angle lens diffusing light from the light source to implement a wide beam angle diffuses light from a central portion to a wide region in a lateral direction by using refraction, and here, it is important to diffuse light in an evenly distributed manner.

As illustrated in FIG. 7A, in a lens $C_L$ having a flat bottom surface according to a comparative example, light L1 at the outermost portion of the light source LS, among light emitted from the light source LS, is made incident to the bottom surface of the lens $C_L$, so the bottom surface partially serves as an incident surface. In this case, the light $C_L$ made incident to the bottom surface is refracted from the bottom surface and travels in a direction toward a central portion, rather than traveling in a direction toward the edges so as to be widely diffused along the initially designed optical path.

As illustrated in FIG. 8A, it can be seen that light distribution is significantly increased within a range from about 15° to 40° due to the light L1 refracted from the bottom surface, with respect to 0° corresponding to an optical axis. Thus, uniformity of an overall light distribution is low. The non-uniform light distribution may degrade brightness and cause a defective color spot such as mura, or the like, in a lighting device or a display device.

As illustrated in FIG. 7B, the lens 10 according to the present exemplary embodiment has a structure in which the incident surface 12 extends toward the light source LS further than bottom surface 11 due to a protrusion structure partially protruding from the bottom surface 11. Thus, unlike the comparative example as described above, light L2 at the outermost portion of the light source LS is entirely made incident through the incident surface 12 and travels in a direction toward the edges along the initially designed optical path so as to be widely diffused.

Thus, as illustrated in FIG. 8B, it can be seen that light distribution is the highest in the optical axis and is deceased symmetrically in a direction away from the optical axis. Thus, uniformity of the light distribution is significantly high, unlike that of FIG. 8A.

A light source module according to an exemplary embodiment will be described with reference to FIG. 9. FIG. 9 is a cross-sectional view schematically illustrating a light source module according to an exemplary embodiment.

Referring to FIG. 9, a light source module 100 according to an exemplary embodiment may include a light emitter 30, a board 40 on which the light emitter 30 is mounted, and a lens 10 mounted on or above the board 40 and disposed on the light emitter 30. Here, the light emitter 30 may indicate the light source LS illustrated in FIGS. 1-5, 7A and 7B.

The light emitter 30 may be a photoelectric device that generates light having a predetermined wavelength by driving power applied from an external source. For example, the light emitter 30 may include a semiconductor light emitting diode (LED) chip including an n-type semiconductor layer, a p-type semiconductor layer, and an active layer disposed therebetween, or a package having the same.

The light emitter 30 may emit blue light, green light, or red light, or may emit white light, ultraviolet light, and the like, depending on a material contained therein or a combination with phosphors.

Figure 10A:
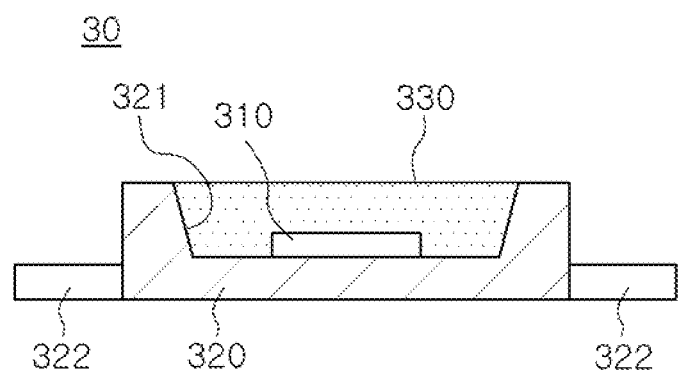
FIGS. 10A and 10B are cross-sectional views illustrating various examples of light emitters employable in the light source module of FIG. 9, according to exemplary embodiments.

As illustrated in FIG. 10A, the light emitter 30 may have a package structure in which an LED (light emitting diode) chip 310 is mounted within a body 320 having a reflective cup 321.

The body 320 may be a base member on which the LED chip 310 is supportedly mounted, and may be formed of a white molding compound having high light reflectivity. This may bring about an effect of increasing a quantity of outwardly emitted light by reflecting light emitted from the LED chip 310. The white molding compound may include thermosetting resins or silicon resins having high heat resistance. Also, thermoplastic resin added with white pigment, a filler, a curing agent, a releasing agent, an antioxidant, an adhesive improver, and the like. Also, the body 320 may be formed of FR-4, CEM-3, an epoxy, ceramics, and the like. Also, the body 320 may be formed of a metal such as aluminum (Al).

The body 320 may include a lead frame 322 for an electrical connection to an external power source. The lead frame 322 may be formed of a material having excellent electrical conductivity, for example, a metal such as aluminum (Al), copper (Cu), and the like. When the body 320 is formed of a metal, an insulating material may be interposed between the body 320 and the lead frame 322.

The reflective cup 321 provided in the body 320 may have a bottom surface on which the LED chip 310 is mounted, from which the lead frame 322 may be exposed. The LED chip 310 may be electrically connected to the exposed lead frame 322.

A size of the cross-section of the reflective cup 321 exposed from an upper surface of the body 320 may be greater than a size of the bottom surface of the reflective cup 321. Here, the cross-section of the reflective cup 321 exposed from the upper surface of the body 320 may define a light emitting surface of the light emitter 30.

The LED chip 310 may be sealed by an encapsulant 330 formed within the reflective cup 321 of the body 320. The encapsulant 330 may include a wavelength conversion material.

For example, at least one or more types of phosphors emitting light having different wavelengths upon being excited by light generated by the LED chip 310 may be contained as a wavelength conversion material. Accordingly, light in various colors including white light may be adjusted to be emitted.

For example, when the LED chip 310 emits blue light, it may be combined with yellow, green, red, and orange phosphors to emit white light. Also, it may include at least one light emitter emitting purple, blue, green, red, or infrared light. In this case, the LED chip 310 may control a color rendering index (CRI) to range from a sodium-vapor (Na) lamp (40) to a sunlight level (100), or the like, and control a color temperature ranging from 2000K to 20000K to generate various levels of white light. If necessary, the LED chip 310 may generate visible light having purple, blue, green, red, orange colors, or infrared light to adjust an illumination color according to a surrounding atmosphere or mood. Also, the LED chip 310 may generate light having a special wavelength stimulating plant growth.

Figure 11:
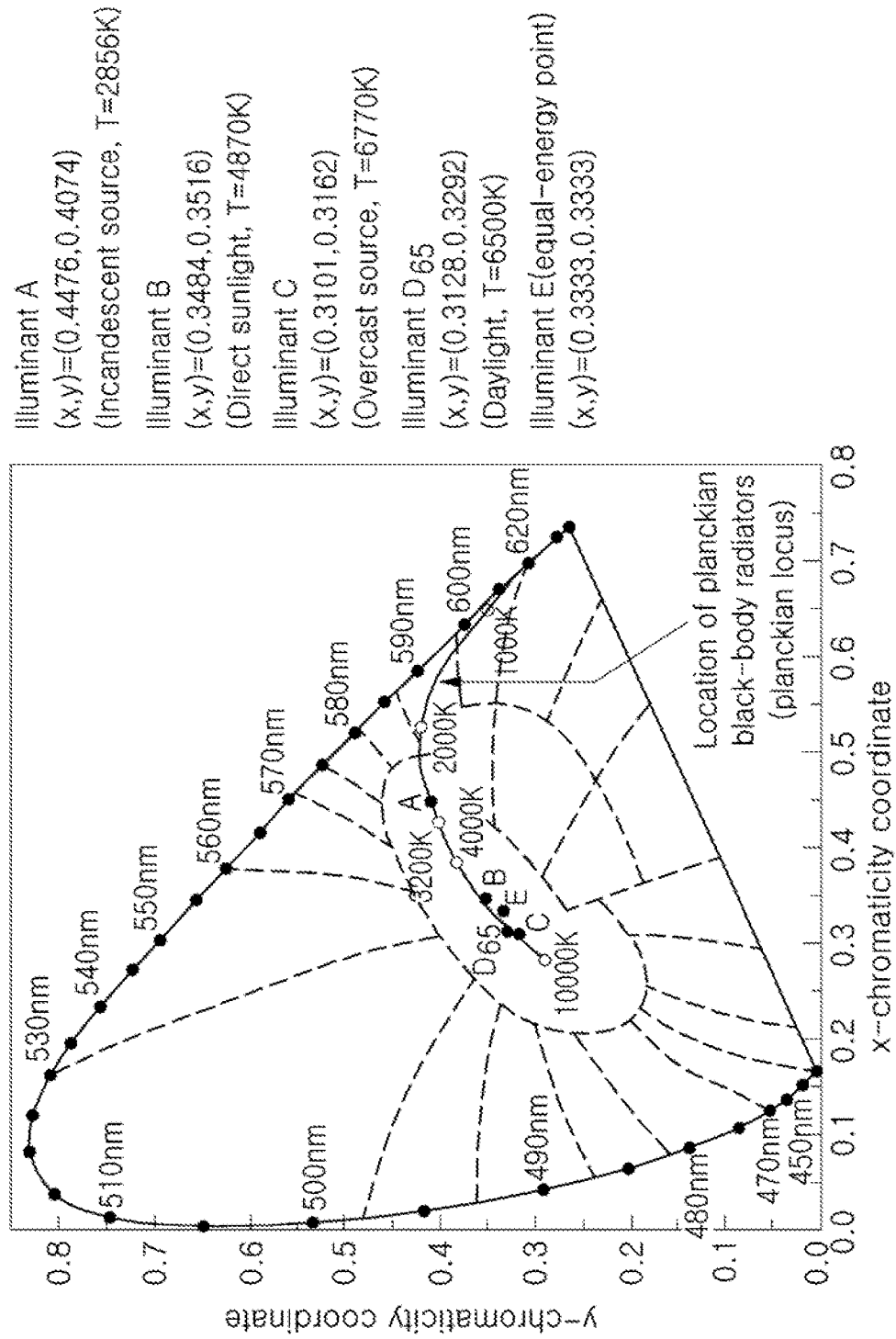
FIG. 11 is a CIE 1931 color space chromaticity diagram, according to an exemplary embodiment.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 11. Alternatively, white light may be positioned in a region surrounded by a spectrum of black body radiation and the segment. A color temperature of white light corresponds to a range from about 2000K to about 20000K.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN^3$:Eu, $Sr_2Si_5N_8$:Eu, $SrSiAl_4N_7$:Eu Fluorides: KSF-based red $K_2SiF_6$:Mn4+

Phosphor compositions should basically conform with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may implement various colors according to sizes.

Figure 10B:
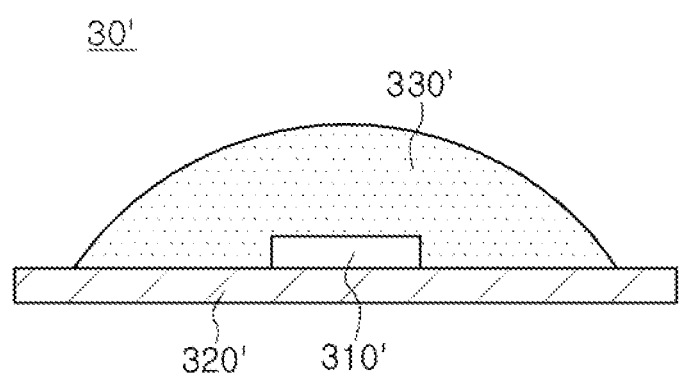

In the present exemplary embodiment, the light emitter 30 has a package structure in which the LED chip 310 is provided within the body 320 having the reflective cup 321, but the present disclosure is not limited thereto. As illustrated in FIG. 10B, a light emitter 30' may have a chip-on-board (COB) structure in which an LED chip 310' is mounted on an upper surface of a body 320'. In this case, the body 320' may be a circuit board with a circuit wiring formed thereon, and an encapsulant 330' may be have a lens structure protruding from an upper surface of the body 320' to cover the LED chip 310'.

Also, in the present exemplary embodiment, light emitter 30 is illustrated as a single package, but the inventive concept is not limited thereto. For example, the light emitter 30 may be the LED chip 310 itself.

The board 40 may be an FR4-type printed circuit board (PCB) or a flexible printed circuit board (FPCB) and may be formed of an organic resin material containing epoxy, triazine, silicon, polyimide, and the like, or any other organic resin material. The board 40 may also be formed of a ceramic material such as silicon nitride, AlN, $Al_2O_3$, and the like, or may be formed of a metal or metallic compound such as a metal-core printed circuit board (MCPCB), a metal copper clad laminated (MCCL), and the like.

A circuit wiring 41 electrically connected to the light emitter 30 may be provided on the board 40.

The lens 10 may be substantially identical to the lens illustrated in FIGS. 1 through 6, and thus, a description thereof will be omitted.

In the present exemplary embodiment, the light source module 100 is illustrated as including the single light emitter 30 and the single lens 10 mounted on the board 40, but the inventive concept is not limited thereto. For example, a plurality of light emitters 30 may be provided and arranged on the board 40, and a plurality of lenses 10 corresponding to the light emitters 30 may be provided and disposed on the light emitters 30, respectively.

Figure 12:
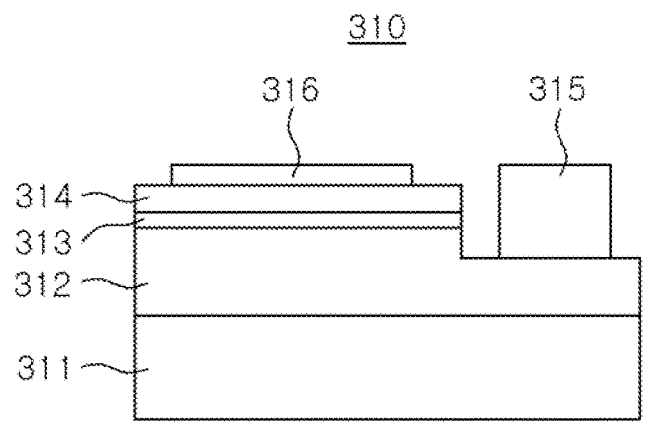
FIGS. 12 through 14 are cross-sectional views illustrating various examples of light emitting diode (LED) chips employable in a light emitter, according to exemplary embodiments.
Figure 13:
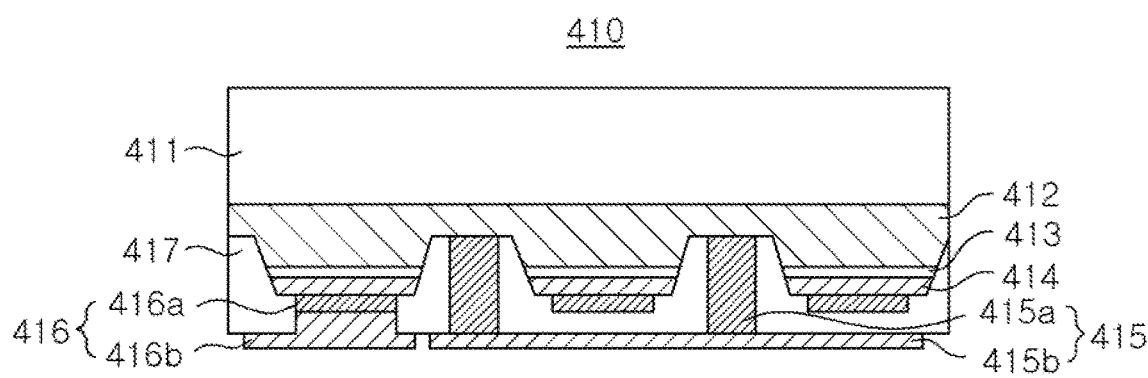
Figure 14:
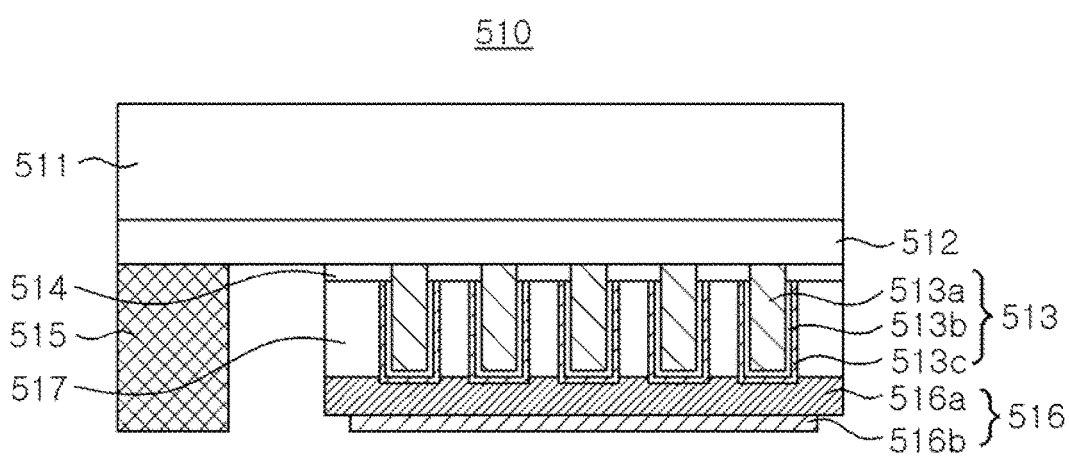

Various examples of LED chips employable in a light emitter will be described with reference to FIGS. 12 through 14. FIGS. 12 through 14 are cross-sectional views illustrating various examples of light emitting diode (LED) chips employable in a light emitter according to an exemplary embodiment.

Referring to FIG. 12, an LED chip 310 may include a first conductivity-type semiconductor layer 312, an active layer 313, and a second conductivity-type semiconductor layer 314 sequentially stacked on a growth substrate 311.

The first conductivity-type semiconductor layer 312 stacked on the growth substrate 311 may be an n-type nitride semiconductor layer doped with an n-type impurity. The second conductivity-type semiconductor layer 314 may be a p-type nitride semiconductor layer doped with a p-type impurity. However, according to an exemplary embodiment, positions of the first and second conductivity-type semiconductor layers 312 and 314 may be interchanged so as to be stacked. The first and second conductivity-type semiconductor layers 312 and 314 may have an empirical formula $Al_xIn_yGa_{(1-x-y)}N$ (here, 0≤x<1, 0≤y<1, 0≤x+y<1), and, for example, materials such as GaN, AlGaN, InGaN, AlInGaN may correspond thereto.

The active layer 313 disposed between the first and second conductivity-type semiconductor layers 312 and 314 may emit light having a predetermined level of energy through electron-hole recombination. The active layer 313 may include a material having an energy band gap smaller than those of the first and second conductivity-type semiconductor layers 312 and 314. For example, in a case in which the first and second conductivity-type semiconductor layers 312 and 314 are formed of a GaN-based compound semiconductor, the active layer 313 may include an InGaN-based compound semiconductor having an energy band gap smaller than that of GaN. Also, the active layer 313 may have a multi-quantum well (MQW) structure in which quantum barrier layers and quantum well layers are alternately stacked, for example, an InGaN/GaN structure. However, exemplary embodiment is not limited thereto and the active layer 313 may have a single quantum well (SQW) structure.

The LED chip 310 may include first and second electrode pads 315 and 316 electrically connected to the first and second conductivity-type semiconductor layers 312 and 314, respectively. The first and second electrode pads 315 and 316 may be disposed and exposed to face in the same direction. The first and second electrode pads 315 and 316 may be electrically connected to a board through wire bonding or flipchip bonding.

An LED chip 410 illustrated in FIG. 13 may include a semiconductor stacked body formed on a growth substrate 411. The semiconductor stacked body may include a first conductivity-type semiconductor layer 412, an active layer 413, and a second conductivity-type semiconductor layer 414.

The LED chip 410 may include first and second electrode pads 415 and 416 respectively connected to the first and second conductivity-type semiconductor layers 412 and 414. The first electrode pad 415 may include a conductive via 415a, connected to the first conductivity-type semiconductor layer 412 through the second conductivity-type semiconductor layer 414 and the active layer 413, and an electrode extending portion 415b connected to the conductive via 415a. The conductive via 415a may be surrounded by an insulating layer 417 so as to be electrically separated from the active layer 413 and the second conductivity-type semiconductor layer 414. The conductive via 415a may be disposed in a region formed by etching the semiconductor stacked body. The amount, shape, and pitch of conductive vias 415a, a contact area with respect to the first conductivity-type semiconductor layer 412, and the like, may be appropriately designed such that contact resistance is reduced. The conductive vias 415a may be arranged in rows and columns on the semiconductor stacked body, improving a current flow. The second electrode pad 416 may include an ohmic contact layer 416a and an electrode extending portion 416b on the second conductivity-type semiconductor layer 414.

An LED chip 510 illustrated in FIG. 14 includes a growth substrate 511, a first conductivity-type semiconductor base layer 512 formed on the growth substrate 511, and a plurality of light emitting nanostructures 513 formed on the first conductivity-type semiconductor base layer 512. The LED chip 510 may further include an insulating layer 514 and a filler portion 517.

Each of the plurality of light emitting nanostructures 513 includes a first conductivity-type semiconductor core 513a, and an active layer 513b and a second conductivity-type semiconductor layer 513c sequentially formed as shell layers on the surface of the first conductivity-type semiconductor core 513a.

In the present exemplary embodiment, it is illustrated that each of the light emitting nanostructures 513 has a core-shell structure, but the present disclosure is not limited thereto and each of the light emitting nanostructures 513 may have any other structure such as a pyramid structure. The first conductivity-type semiconductor base layer 512 may be a layer providing a growth surface for the light emitting nanostructures 513. The insulating layer 514 may provide an open region allowing the light emitting nanostructures 513 to be grown, and may be formed of a dielectric material such as $SiO_2$ or $SiN_x$. The filler portion 517 may structurally stabilize the light emitting nanostructures 513 and allows light to be transmitted or reflected. Alternatively, in a case in which the filler portion 517 includes a light-transmissive material, the filler portion 517 may be formed of a transparent material such as $SiO_2$, $SiN_x$, an elastic resin, silicon, an epoxy resin, a polymer, or plastic. If necessary, in a case in which the filler portion 517 includes a reflective material, the filler portion 517 may be formed of metal powder or ceramic powder having high reflectivity mixed with a polymer material such as polypthalamide (PPA), or the like. The highly reflective ceramic powder may be formed of or include at least one of $TiO_2$, $Al_2O_3$, $Nb_2O_5$, $Al_2O_3$ and ZnO. Alternatively, a highly reflective metal such as aluminum (Al) or silver (Ag) may be used.

The first and second electrode pads 515 and 516 may be disposed on lower surfaces of the light emitting nanostructures 513. The first electrode pad 515 is positioned on an exposed upper surface of the first conductivity-type semiconductor base layer 512, and the second electrode pad 516 includes an ohmic contact layer 516a and an electrode extending portion 516b formed below the light emitting nanostructures 513 and the filler portion 517. Alternatively, the ohmic contact layer 516a and the electrode extending portion 516b may be integrally formed.

Lighting devices according to various examples employing a light source module according to an exemplary embodiment will be described with reference to FIGS. 15 through 17.

Figure 15:
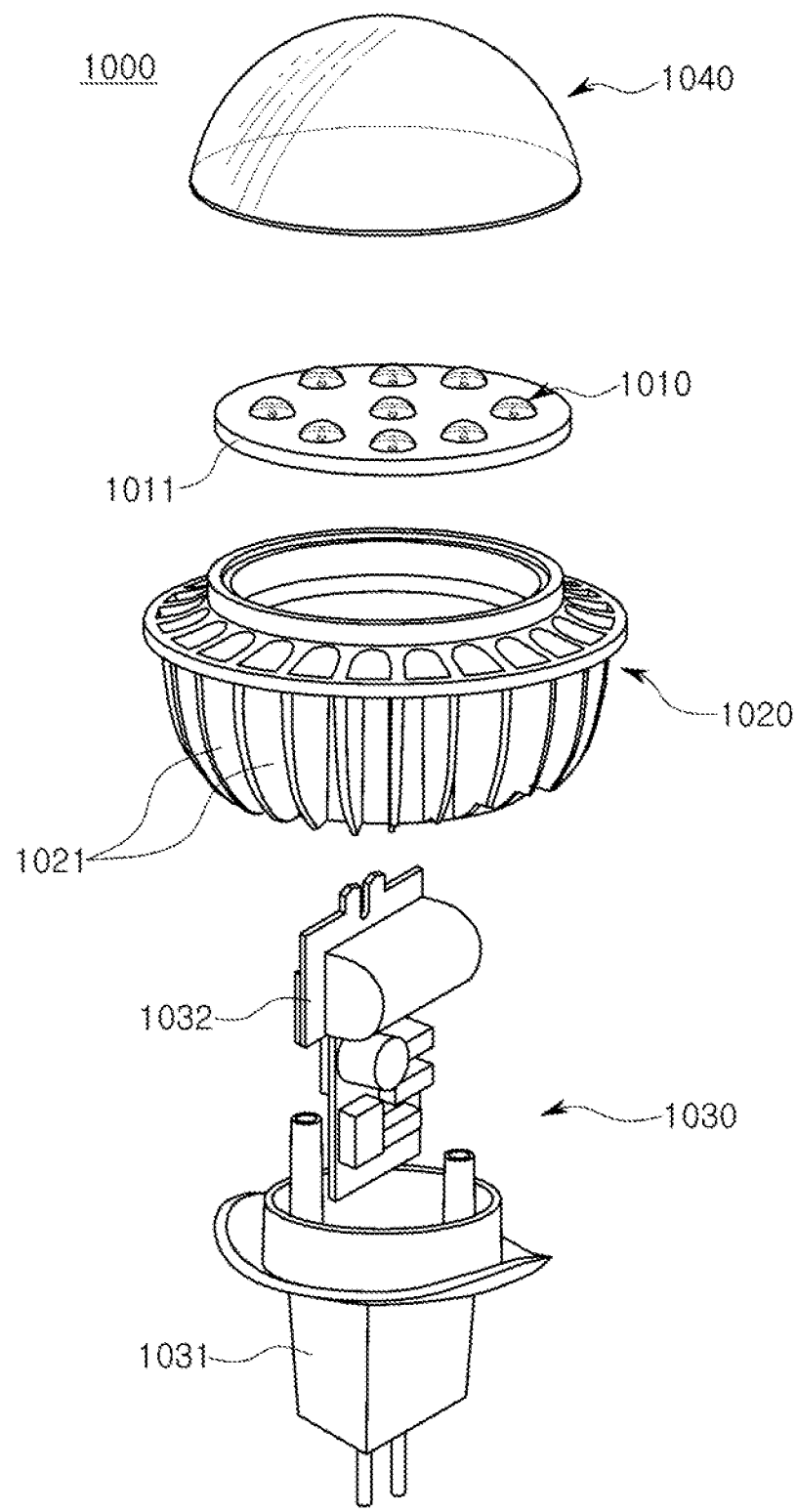
FIG. 15 is an exploded perspective view schematically illustrating a lighting device (bulb type), according to an exemplary embodiment.

FIG. 15 is an exploded perspective view schematically illustrating a lighting device (bulb type) according to an exemplary embodiment.

Referring to FIG. 15, a lighting device 1000 according to an exemplary embodiment may be a bulb-type lamp and may be used as an indoor lighting device, for example, a downlight. The lighting device 1000 may include a housing 1020 having an electrical connection structure 1030 and at least one light source module 1010 mounted on the housing 1020. The lighting device 1000 may further include a cover 1040 covering the at least one light source module 1010.

The light source module 1010 may be substantially identical to the light source module illustrated in FIG. 9, and thus, a detailed description thereof will be omitted. The light source module 1010 may have a configuration in which a plurality of light emitters and lenses are installed and disposed on a board 1011.

The housing 1020 serves both as a frame supporting the light source module 1010 and as a heat sink outwardly dissipating heat generated by the light source module 1010. To this end, the housing 1020 may be formed of a material being substantial (rigid, sturdy, or solid) and having high heat conductivity. For example, the housing 1020 may be formed of a metal material such as aluminum (Al), or a heat dissipation resin.

A plurality of heat dissipation fins 1021 may be provided in an outer surface of the housing 1020 in order to increase a contact area with air to enhance heat dissipation efficiency.

The housing 1020 has the electrical connection structure 1030 electrically connected to the light source module 1010. The electrical connection structure 1030 may include a terminal 1031 and a driver 1032 supplying driving power supplied through the terminal 1031 to the light source module 1010.

The terminal 1031 serves to allow the lighting device 1000 to be fixedly installed in, for example, a socket, or the like, so as to be electrically connected. In the present exemplary embodiment, the terminal 1031 is illustrated as having a slidably inserted pin-type structure, but the exemplary embodiment is not limited thereto. If necessary, the terminal 1031 may have an Edison type structure having threads going around to be inserted.

The driver 1032 serves to convert external driving power into a current source appropriate for driving the light source module 1010, and provide the same. The driver 1032 may be configured as, for example, an AC-DC converter, a rectifying circuit component, a fuse, or the like. Also, the driver 1032 may further include a communications module implementing remote controlling according to circumstances.

The cover 1040 may be installed on the housing 1020 to cover the light source module 1010 and have a convex lens shape or a bulb shape. The cover 1040 may be formed of a light-transmissive material and contain a light dispersion material.

Figure 16:
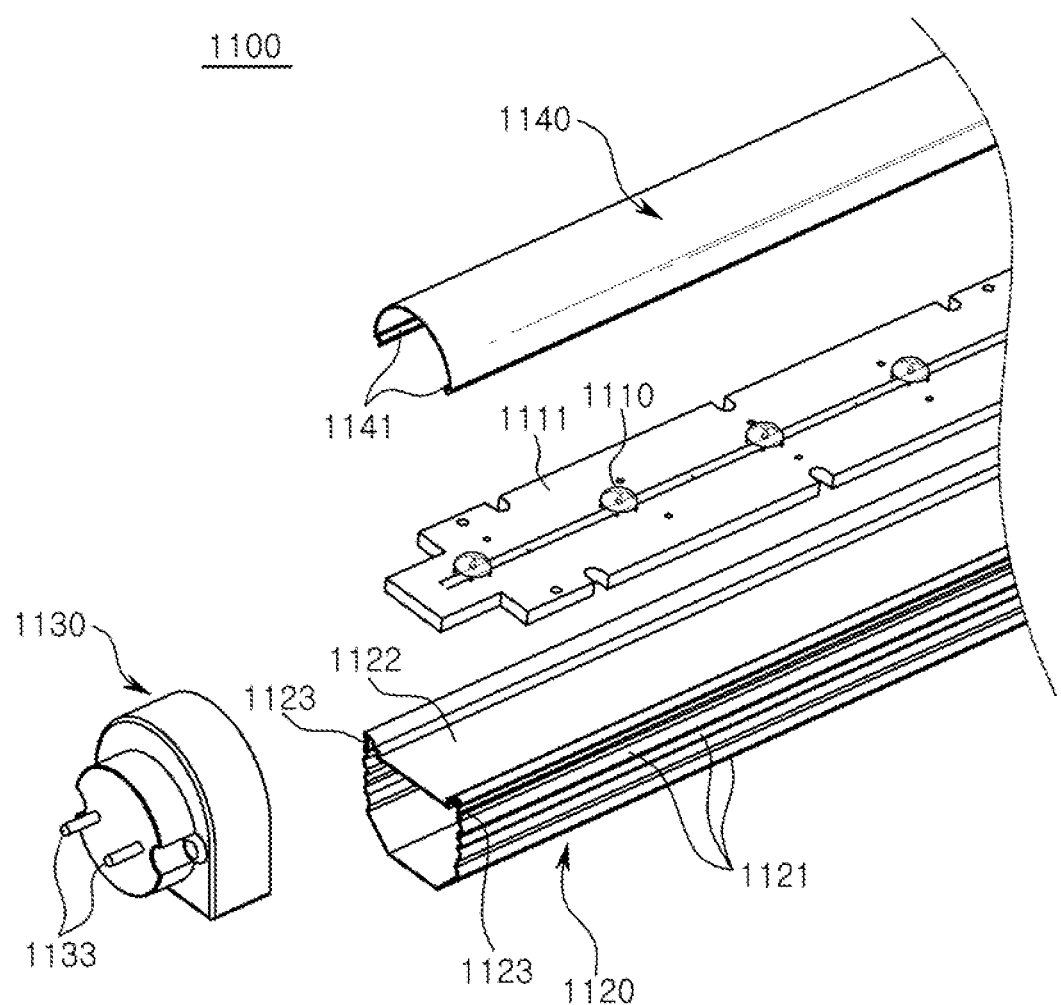
FIG. 16 is an exploded perspective view schematically illustrating a lighting device (L lamp type), according to an exemplary embodiment.

FIG. 16 is an exploded perspective view schematically illustrating a lighting device according to another exemplary embodiment. Referring to FIG. 16, a lighting device 1100 may be, for example, a bar-type lamp and include a light source module 1110, a housing 1120, a terminal 1130, and a cover 1140.

As the light source module 1110, the light source module illustrated in FIG. 9 may be employed, so a detailed description will be omitted. The light source module 1110 may have a configuration in which a plurality of light emitters and lenses are installed and arranged on a board 1111.

The housing 1120 may allow the light source module 1110 to be fixedly mounted on one surface 1122 thereof and dissipate heat generated by the light source module 1110 outwardly. To this end, the housing 1120 may be formed of a material having excellent thermal conductivity, for example, metal, and a plurality of heat dissipation fins 1121 may protrude from both lateral surfaces of the housing 1120 to dissipate heat.

The light source module 1110 may be mounted on one surface 1122 of the housing 1120.

The cover 1140 is fastened to stoppage grooves 1123 of the housing 1120 to cover the light source module 1110. The cover 1140 may have a semicircular curved surface to allow light generated by the light source module 1110 to be uniformly radiated to the outside overall. Protrusions 1141 may be formed in a longitudinal direction on a bottom surface of the cover 1140 and engaged with the stoppage grooves 1123 of the housing 1120.

The terminal 1130 may be provided on at least one open side, among both end portions of the housing 1120 in a longitudinal direction to supply power to the light source module 1110 and include electrode pins 1133 protruding outwardly.

Figure 17:
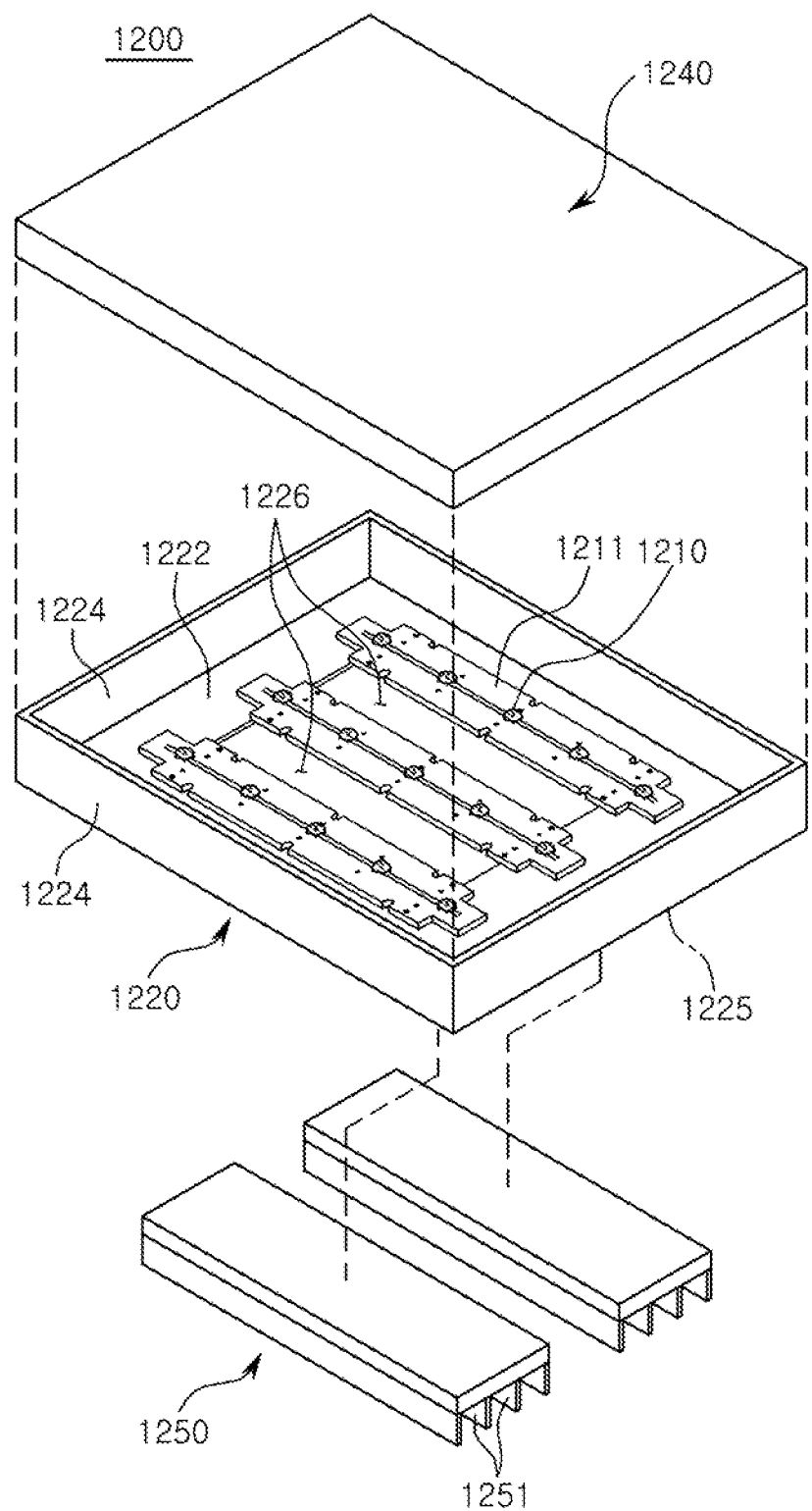
FIG. 17 is an exploded perspective view schematically illustrating a lighting device (planar type), according to an exemplary embodiment.

FIG. 17 is an exploded perspective view schematically illustrating a lighting device according to another exemplary embodiment. Referring to FIG. 17, a lighting device 1200 may have, for example, a surface light source-type structure and may include a light source module 1210, a housing 1220, a cover 1240, and a heat sink 1250.

As the light source module 1210, the light source illustrated in FIG. 9 may be employed, so a detailed description thereof will be omitted. The light source module 1210 may have a configuration in which a plurality of light emitters and lenses are installed and arranged on a board 1211.

The housing 1220 may have a box-shaped structure including one surface 1222 on which the light source module 1210 is mounted and lateral surfaces 1224 extending from the circumference of the one surface 1222. The housing 1220 may be formed of a material having excellent thermal conductivity, for example, a metal, that may dissipation heat generated by the light source module 1210 outwardly.

A hole 1226 to which the heat sink 1250 (to be described below) are insertedly fastened may be formed in the one surface 122 of the housing 1220 in a penetrating manner. The light source module 1210 mounted on the one surface 1222 may partially span the hole 1226 so as to be exposed to the outside.

The cover 1240 may be fastened to the housing 1220. The cover 1240 may have an overall flat structure.

The heat sink 1250 may be fastened to the hole 1226 through the other surface 1226 of the housing 1220. The heat sink 1250 may be in contact with the light source module 1210 through the hole 1226 to dissipate heat from the light source module 1210 outwardly. In order to increase heat dissipation efficiency, the heat sink 1250 may have a plurality of heat dissipation fins 1251. The heat sink 1250 may be formed of a material having excellent thermal conductivity, like the housing 1220.

A lighting device using a light emitter may be applied to an indoor lighting device or an outdoor lighting device according to the purpose thereof. The indoor lighting device may include a lamp, a fluorescent lamp (LED-tube), or a flat panel type lighting device replacing an existing lighting fixture (retrofit), and the outdoor lighting device may include a streetlight, a security light, a floodlight, a scene lamp, a traffic light, and the like.

Also, the lighting device using LEDs may be utilized as an internal or external light source of a vehicle. As an internal light source, the LED lighting device may be used as an indoor light, a reading light, or as various dashboard light sources of a vehicle. As an external light source, the LED lighting device may be used as a headlight, a brake light, a turn signal lamp, a fog light, a running light, and the like.

In addition, the LED lighting device may also be applicable as a light source used in robots or various mechanic facilities. Lighting using LED light within a particular wavelength band may promote plant growth and stabilize a person's mood or treat diseases using emotional lighting.

A lighting system employing the lighting devices described above with reference to FIGS. 18 through 21 will be described. A lighting system 2000 according an exemplary embodiment may automatically control a color temperature according to a surrounding environment (for example, temperature and humidity) and provide a lighting device used for emotional lighting satisfying human emotions, rather than serving as simple lighting.

Figure 18:
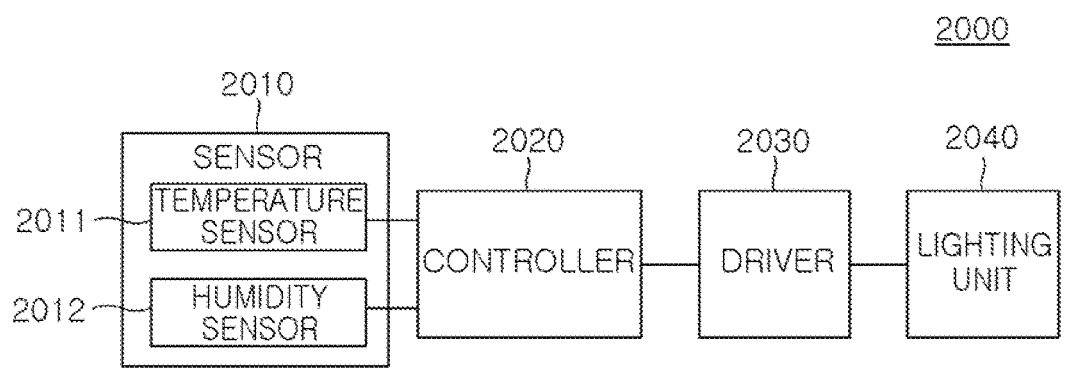
FIG. 18 is a block diagram schematically illustrating a lighting system, according to an exemplary embodiment.

FIG. 18 is a block diagram schematically illustrating a lighting system according to an exemplary embodiment.

Referring to FIG. 18, a lighting system 2000 according to an exemplary embodiment may include a sensor 2010, a controller 2020, a driver 2030, and a lighting unit 2040.

The sensor 2010 may be installed indoors or outdoors, and may have a temperature sensor 2011 and a humidity sensor 2012 to measure at least one air condition among an ambient temperature and humidity not being limited thereto. The sensor 2010 delivers information about the measured temperature and humidity to the controller 2020 electrically connected thereto.

The controller 2020 may compare the measured air temperature and humidity with air conditions (temperature and humidity ranges) previously set by a user, and determine a color temperature of the lighting unit 2040 corresponding to the measured temperature and humidity. The controller 2020 may be electrically connected to the driver 2030, and control the driver 2030 to drive the lighting unit 2040 at the determined color temperature.

Figure 19:
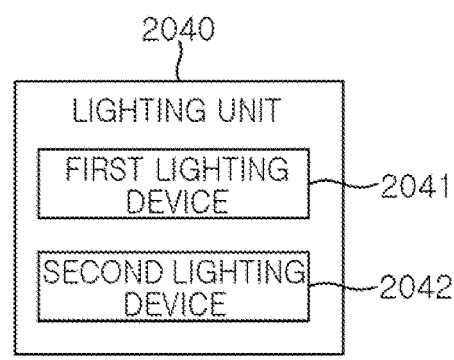
FIG. 19 is a block diagram schematically illustrating a detailed configuration of a lighting unit of the lighting system illustrated of FIG. 18, according to an exemplary embodiment.

The lighting unit 2040 operates according to power supplied by the driver 2030. The lighting unit 2040 may include at least one lighting device illustrated in FIGS. 15 to 17. For example, as illustrated in FIG. 19, the lighting unit 2040 may include a first lighting device 2041 and a second lighting device 2042 having different color temperatures, and each of the lighting devices 2041 and 2042 may include a plurality of light emitters emitting the same white light.

The first lighting device 2041 may emit white light having a first color temperature, and the second lighting device 2042 may emit white light having a second color temperature, where the first color temperature may be lower than the second color temperature. Conversely, the first color temperature may be higher than the second color temperature. Here, white color having a relatively low color temperature corresponds to a warm white color, and white color having a relatively high color temperature corresponds to a cold white color. When power is supplied to the first and second lighting devices 2041 and 2042, the first and second lighting devices 2041 and 2042 emit white light having first and second color temperatures, respectively, and their respective white light may be mixed to generate white light having a color temperature determined by the controller 2020.

In detail, in a case in which the first color temperature is lower than the second color temperature, if the color temperature determined by the controller 2020 is relatively high, an amount of light from the first lighting device 2041 may be reduced and an amount of light from the second lighting device 2042 may be increased to generate mixed white light having the determined color temperature. Conversely, when the determined color temperature is relatively low, an amount of light from the first lighting device 2041 may be increased and an amount of light from the second lighting device 2042 may be reduced to generate white light having the determined color temperature. Here, the amount of light from each of the lighting devices 2041 and 2042 may be determined by controlling an amount of power supplied from the driver 2030 to the entirety of light emitters or by controlling the number of light emitters driven.

Figure 20:
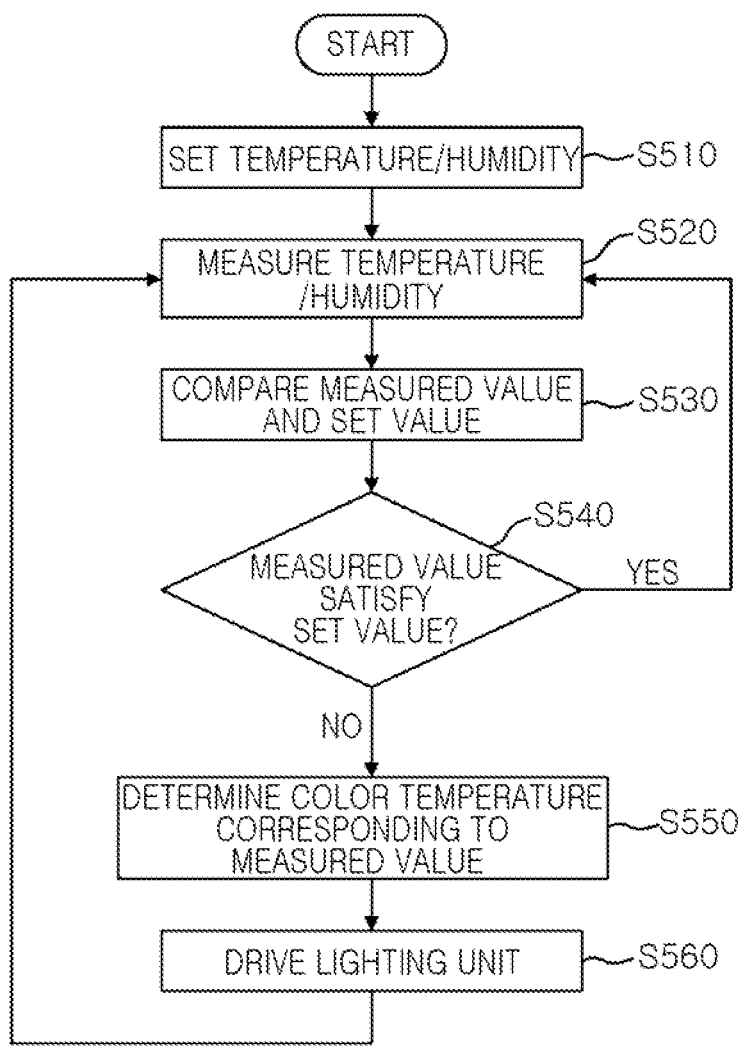
FIG. 20 is a flow chart illustrating a method for controlling the lighting system illustrated in FIG. 18, according to an exemplary embodiment.

FIG. 20 is a flowchart illustrating a method of controlling the lighting system of FIG. 18. Referring to FIG. 20, the user first sets a color temperature according to each of a plurality of temperature and humidity ranges through the controller 2020 in operation S510. The set temperature and humidity data are stored in the controller 2020.

In general, when a color temperature is higher than or equal to 6000K, a color providing a cool feeling, such as blue, may be produced, and when a color temperature is lower than 4000K, a color providing a warm feeling, such as red, may be produced. Thus, in the present exemplary embodiment, when temperature and humidity exceed 20° C. and 60%, respectively, the user may set the light emitting unit 2040 to be turned on to have a color temperature higher than 6000K through the controller 2020; when the temperature and humidity range from 10° C. to 20° C. and 40% to 60%, respectively, the user may set the light emitting unit 2040 to be turned on to have a color temperature ranging from 4000K to 6000K; and when the temperature and humidity are lower than 10° C. and 40%, respectively, the user may set the light emitting unit 2040 to be turned on to have a color temperature lower than 4000K.

Next, the 2010 measures at least one of conditions among ambient temperature and humidity, not being limited thereto, in operation S520. Information about the temperature and humidity measured by the sensor 2010 is delivered to the controller 2020.

Subsequently, the controller 2020 compares the current temperature and humidity with the preset values, in operation S530. Here, the preset values are temperature and humidity data which have been set by the user and stored in the controller 2020 in advance. The controller 2020 compares the measured temperature and humidity with the preset values, respectively.

According to the comparison, the controller 2020 determines whether the measured temperature and humidity are included in a range of temperature and humidity preset to a current color temperature, in operation S540. When the measured temperature and humidity are included in the preset range, the controller 2020 maintains the current color temperature, and again measures the temperature and humidity, in operation S520. Meanwhile, when the measured temperature and humidity are not included the preset range, the controller 2020 detects a range preset to the measured temperature and humidity, and determines a corresponding color temperature, in operation S550. The controller 2020 controls the driver 1030 to drive the light emitting unit 2040 at the determined color temperature.

Then, the driver 2030 drives the light emitting unit 2040 to have the determined color temperature, in operation S560. The driver 2030 supplies power required to drive the light emitting unit 2040 to implement the predetermined color temperature. Accordingly, the light emitting unit 2040 may be adjusted to have a color temperature corresponding to the temperature and humidity previously set by the user according to ambient temperature and humidity.

In this manner, the lighting system is able to automatically control a color temperature of the indoor lighting according to changes in ambient temperature and humidity, thereby satisfying human emotions varying according to changes in the surrounding natural environment and providing psychological stability.

Figure 21:
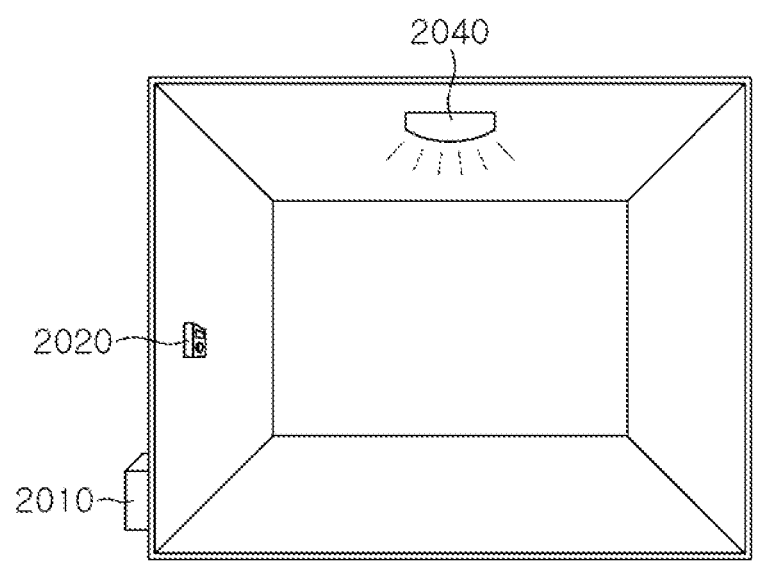
FIG. 21 is a view schematically illustrating the way in which the lighting system illustrated in FIG. 18 is used, according to an exemplary embodiment.

FIG. 21 is a view schematically illustrating the use of the lighting system of FIG. 18. As illustrated in FIG. 21, the light emitting unit 2040 may be installed on the ceiling as an indoor lamp. Here, the sensor 2010 may be implemented as a separate device and installed on an external wall in order to measure outdoor temperature and humidity. The controller 2020 may be installed in an indoor area to allow the user to easily perform setting and ascertainment operations. The lighting system is not limited thereto, and may be installed on the wall in place of an interior illumination device or may be applied to a lamp, such as a desk lamp, that can be used indoors and outdoors.

The lighting device using an LED as described above may be altered in terms of an optical design thereof according to a product type, a location, and a purpose. For example, in relation to the foregoing emotional illumination, a technique for controlling lighting by using a wireless (remote) control technique utilizing a portable device such as a smartphone may be provided, in addition to a technique of controlling a color, temperature, brightness, and a hue of illumination (or lighting).

Also, in addition, a visible wireless communications technology aimed at simultaneously achieving a unique purpose of an LED light source and a purpose of a communications unit by adding a communications function to LED lighting devices and display devices may be available. This is because an LED light source has a longer lifespan and excellent power efficiency, implements various colors, supports a high switching rate for digital communications, and is available for digital control, in comparison with existing light sources.

The visible light wireless communications technology is a wireless communications technology transferring information wirelessly by using light having a visible light wavelength band recognizable by human eyes. The visible light wireless communications technology is distinguished from a wired optical communications technology in that it uses light having a visible light wavelength band, and that a communications environment is based on a wireless scheme.

Also, unlike RF wireless communications, the visible light wireless communications technology has excellent convenience and physical security properties as it can be freely used without being regulated or needing permission in the aspect of frequency usage, is differentiated in that a user can check a communications link with his/her eyes, and above all, the visible light wireless communications technology has features as a fusion technique obtaining both a unique purpose as a light source and a communications function.

As set forth above, according to exemplary embodiments, a lens for a light emitter, a light source module, a lighting device, and a lighting system, capable of preventing generation of mura and uniformly distributing light may be provided.

Advantages and effects are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the scope of the present invention as defined by the appended claims.

What is claimed is:

1. A lens for a light emitter, the lens comprising:
a bottom surface;
an incident surface connected to the bottom surface at a central region of the bottom surface, and configured being disposed on or above a light source to allow light emitted from the light source to be made incident thereto and travel in an interior of the lens; and
an output surface connected to the bottom surface at an edge of the bottom surface and configured to allow the light which has traveled in the interior of the lens to be emitted outwardly therefrom,
wherein the incident surface forms a surface of a recess portion recessed from the central region of the bottom surface through which an optical axis of the light source is to pass in a direction toward the output surface,
wherein the bottom surface comprises a first surface connected to the output surface at the edge of the bottom surface and extending toward a center of the bottom surface, a second surface bent from an end of the extended first surface and extending toward a position where the light source is to be disposed, and a third surface bent from an end of the second surface and extending toward the recess portion,
wherein the second surface and the third surface have an annular structure surrounding the recess portion, and
wherein the central region of the bottom surface, including the second and the third surfaces, protrudes with respect to the other region of the bottom surface including the first surface.

2. The lens of claim 1, wherein the first surface and the third surface form a step portion formed of the second surface.

3. The lens of claim 1, wherein the second surface is perpendicular or sloped obliquely with respect to the first surface and the third surface.

4. The lens of claim 1, wherein the recess portion is disposed to face the position where the light source is to be disposed.

5. The lens of claim 1, further comprising a support portion protruding from the bottom surface.

6. A lens for a light emitter, the lens comprising:
a bottom surface;
an incident surface forming a recess portion recessed at a central region of the bottom surface, and configured to be disposed on or above a light source to allow light emitted from the light source to be made incident thereto and travel in an interior of the lens;
an output surface connected to the bottom surface at an edge of the bottom surface and configured to allow the light which has traveled in the interior of the lens to be emitted outwardly therefrom; and
a protrusion provided on a circumference of the recess portion of the bottom surface and protruding to form a step with respect to the bottom surface
wherein the bottom surface comprises a first surface connected to the output surface at the edge of the bottom surface and extending toward a center of the bottom surface, a second surface bent from an end of the extended first surface and extending toward a position where the light source is to be disposed, and a third surface bent from an end of the second surface and extending toward the recess portion,
wherein the second surface and the third surface have an annular structure surrounding the recess portion, and
wherein the central region of the bottom surface, including the second and the third surfaces, protrudes with respect to the other region of the bottom surface including the first surface.

7. The lens of claim 6, wherein the protrusion has an annular shape having a through hole, and an inner surface of the through hole is connected to the incident surface.

8. The lens of claim 6, wherein the protrusion is formed of a material identical to that of the lens.

9. The lens of claim 6, wherein the protrusion has an uneven surface for scattering light.

10. The lens of claim 6, further comprising a support portion provided to be adjacent to the protrusion on the bottom surface,
wherein the support portion protrudes longer than the protrusion with respect to the light source.

11. A lens for a light emitter, the lens comprising:
a bottom surface;
an incident surface forming a recess from a central region of the bottom surface, and configured to be disposed on or above a light source;
an output surface facing the incident surface through an interior of the lens; and
a protrusion formed on the bottom surface, disposed around a circumference of the recess and protruding from the bottom surface,
wherein an inner surface of the protrusion facing a center of the bottom surface is connected to the incident surface to form a part of the incident surface,
wherein the incident surface forms a surface of the recess through which an optical axis of the light source is to pass in a direction toward the output surface,
wherein the bottom surface comprises a first surface connected to the output surface at the edge of the bottom surface and extending toward a center of the bottom surface, a second surface bent from an end of the extended first surface and extending toward a position where the light source is to be disposed, and a third surface bent from an end of the second surface and extending toward the recess,
wherein the second surface and the third surface have an annular structure surrounding the recess portion, and wherein the central region of the bottom surface, including the second and the third surfaces, protrudes with respect to the other region of the bottom surface including the first surface.

12. The lens of claim 11, wherein the protrusion is formed of a material identical or substantially identical to that of the lens.

13. A light source module comprising;
a light emitter for the light source; and
the lens of claim 11,
wherein the light emitter is disposed under or below the recess of the bottom surface of the lens such that a lower-most portion of the protrusion is disposed below a top surface of the light source so that an entirety of the light emitted from a top surface of the light source is incident on the incident surface.

14. The light source module of claim 13, wherein a bottom-most edge of the inner surface of the protrusion is disposed below a surface of the light emitter from which all beams of the light is emitted.

* * * * *